(12) United States Patent
Gorecki et al.

(10) Patent No.: US 10,103,717 B2
(45) Date of Patent: Oct. 16, 2018

(54) LOW POWER BUFFER WITH DYNAMIC GAIN CONTROL

(71) Applicant: INPHI CORPORATION, Santa Clara, CA (US)

(72) Inventors: James Lawrence Gorecki, Hillsboro, OR (US); Han-Yuan Tan, Santa Clara, CA (US)

(73) Assignee: INPHI CORPORATION, Santa Clara, CA (US)

( * ) Notice: Subject to any disclaimer, the term of this patent is extended or adjusted under 35 U.S.C. 154(b) by 0 days.

(21) Appl. No.: 15/800,848

(22) Filed: Nov. 1, 2017

(65) Prior Publication Data

US 2018/0054191 A1 Feb. 22, 2018

Related U.S. Application Data

(63) Continuation of application No. 15/375,048, filed on Dec. 9, 2016, now Pat. No. 9,837,998, which is a
(Continued)

(51) Int. Cl.
*H04B 1/16* (2006.01)
*H03K 5/02* (2006.01)
(Continued)

(52) U.S. Cl.
CPC .......... *H03K 5/023* (2013.01); *H03F 3/3001* (2013.01); *H03F 3/3033* (2013.01);
(Continued)

(58) Field of Classification Search
CPC ..... H03K 5/023; H03K 3/012; H03M 1/1245; H03M 1/38; H04B 1/16; H03G 3/20; H03F 3/45076
(Continued)

(56) References Cited

U.S. PATENT DOCUMENTS 6,480,128 B1 * 11/2002 Bach ................ G11C 27/02
327/96
6,847,807 B1 * 1/2005 Fujiki ............... H03G 3/3036
330/75

(Continued)

OTHER PUBLICATIONS

Cheng-Chung Hus et al., "An 11b 800MS/s Time-Interleaved ADC wth Digital Background Calibration", Proceedings of the 2007 International Solid State Circuit Conference, Feb. 14, 2007, pp. 464-465, 615.

(Continued)

*Primary Examiner* — Siu Lee (57) ABSTRACT

The present disclosure provides a detailed description of techniques for implementing a low power buffer with dynamic gain control. More specifically, some embodiments of the present disclosure are directed to a buffer having a gain boost configuration and a current shunt circuit to control the gain of a respective gain boosting transistor of the gain boost configuration. The current shunt circuit and resulting gain are dynamically controlled by a gain control signal such that the buffer gain can be adjusted to within an acceptable range of the target gain for the current operating and device mismatch conditions. In one or more embodiments, the gain boost configuration with dynamic gain control can be deployed in a full differential implementation. Both analog and digital dynamic calibration and control techniques can be used to provide the gain control signals to multiple current shunt circuits and multiple buffers.

5 Claims, 11 Drawing Sheets

Related U.S. Application Data continuation of application No. 14/614,253, filed on Feb. 4, 2015, now Pat. No. 9,553,569.

(51) Int. Cl.

| | | |
|---|---|---|
| *H03K 5/01* | (2006.01) | |
| *H03F 3/30* | (2006.01) | |
| *H03F 3/45* | (2006.01) | |
| *H03F 3/68* | (2006.01) | |
| *H03G 3/20* | (2006.01) | |
| *H03K 3/012* | (2006.01) | |
| *H03M 1/12* | (2006.01) | |
| *H03M 1/38* | (2006.01) | |
| *H03M 1/66* | (2006.01) | |

(52) U.S. Cl.
CPC ..... *H03F 3/45076* (2013.01); *H03F 3/45179* (2013.01); *H03F 3/68* (2013.01); *H03G 3/20* (2013.01); *H03K 3/012* (2013.01); *H03K 5/01* (2013.01); *H03K 5/02* (2013.01); *H03M 1/1245* (2013.01); *H03M 1/38* (2013.01); *H03M 1/66* (2013.01); *H04B 1/16* (2013.01)

(58) Field of Classification Search
USPC .................................................. 375/316, 345
See application file for complete search history.

(56) References Cited

U.S. PATENT DOCUMENTS 8,860,513 B1 * 10/2014 Chong ................ H03K 3/0322
 331/172
9,837,998 B2 * 12/2017 Gorecki ................. H03K 5/01

OTHER PUBLICATIONS

Sandeep Gupta et al., "A 1GS/s 11b Time-Interleaved ADC in 0.13μm CMOS", Proceedings of the 2006 International Solid State Circuit Conference, Feb. 8, 2006, Session 31-6.

Shahriar Shahramian et al., "A 30-GS/s Track and Hold Amplifier in 0.13-μm CMOS Technology", IEEE 2006 Custom Integrated Circuits Conference, 2006, pp. 493-496.

Simon Louwsma et al., "A Time-Interleaved Track & Hold in 0.13μm CMOS sub-sampling a 4 GHz Signal with 43dB SNDR", IEEE 2007 Custom Integrated Circuits Conference, 2007, pp. 329-332.

Francesco Centurelli et al., "Design Solutions for Sample-and-Hold Circuits in CMOS Nanometer Technologies", IEEE Transactions of Circuits and Systrems-II: Express Briefs, , Jun. 2009, pp. 459-463, vol. 56, No. 6.

Tang Kai et al., "A 20GSps Track-and-Hold Circuit in 90nm CMOS Technology", 2012 International Conference on Advanced Technologies for Communications, 2012, pp. 237-240.

* cited by examiner

LOW POWER BUFFER WITH DYNAMIC GAIN CONTROL

RELATED APPLICATIONS

The present application is a continuation of U.S. patent application Ser. No. 15/375,048 filed on Dec. 9, 2016, which is a continuation of U.S. patent application Ser. No. 14/614,253 filed on Feb. 4, 2015, now U.S. Pat. No. 9,553,569 issued on Jan. 24, 2017 the entire content of which is incorporated herein by reference. The present application is also related to co-pending U.S. patent application Ser. No. 14/614,257, filed on Feb. 4, 2015, now U.S. Pat. No. 9,432,000, issued on Aug. 30, 2016, which is hereby incorporated by reference in its entirety.

FIELD

This disclosure relates to the field of buffers for high resolution ADCs and more particularly to techniques for low power buffers with dynamic gain control.

BACKGROUND

High resolution, high speed analog-to-digital converters (ADCs) can require buffers to isolate a high impedance track-and-hold (TAH) stage from one or more sample-and-hold (SAH) stages preceding the ADC. In some cases, buffers can be used to isolate successive SAH stages. Such buffer implementations can be a key component in enabling and advancing high speed communication (e.g., 100 Gigabit Ethernet) networks and systems. For example, a 28 Gbps serial link communication receiver might require multiple successive approximation register (SAR) ADCs, each with one or more buffers exhibiting at least the following characteristics: wide bandwidth, very fast large signal settling and slewing (e.g., low output impedance), high linearity over the full analog input signal, low noise, high power supply rejection, and high input impedance over the wide bandwidth (e.g., near or in excess of the Nyquist rate). Such receivers might also demand the buffer exhibit low power consumption (e.g., 1V supply voltage), which further requires the buffer gain to be near unity.

A buffer exhibiting the aforementioned characteristics is often referred to herein as a buffer having a "gain boost configuration". Further details regarding general approaches to making and using a buffers with gain boost configuration are described in U.S. application Ser. No. 14/614,257, now U.S. Pat. No. 9,432,000, entitled "LOW POWER BUFFER WITH GAIN BOOST". The disclosed gain boost configuration has a first transistor that receives an input signal and a second transistor that receives a complement of the input signal. The first transistor is configured to generate a non-inverting response to the input signal, and the second transistor is configured to generate an inverting response to the complement of the input signal and to generate a negative drain transconductance (e.g., $g_{ds}$) effect, enabling the buffer to exhibit low power and unity gain across a wide bandwidth. In one or more embodiments, the gain boost configuration can be deployed in a full differential implementation. In one or more embodiments, the buffer can include techniques for improving linearity, DC level shifts, capacitive input loading, and output slewing, settling, and drive capabilities. The intrinsic gain of the gain boost configuration can be set near a target gain (e.g., unity) by simulating the buffer over worst case process, voltage, temperature, and device mismatch (e.g., PVTM) variations and adjusting various design attributes (e.g., transistor sizes) to meet or exceed the target gain at all corners. However, the resulting actual gain of the manufactured buffer at a given operating condition can vary significantly from the target gain. As the speed of the underlying circuit fabrication processes increases (e.g., with the advancement of low power, high speed communication system implementations), such gain variations also increase.

Techniques are needed address the problem of implementing a low power buffer that can operate at a target gain under various process, voltage, temperature, and device mismatch conditions. None of the aforementioned legacy approaches achieve the capabilities of the herein-disclosed techniques for low power buffers with dynamic gain control. Therefore, there is a need for improvements.

SUMMARY

The present disclosure provides improved techniques to address the aforementioned issues with legacy approaches. More specifically, the present disclosure provides a detailed description of techniques for implementing a low power buffer with dynamic gain control. The claimed embodiments address the problem of implementing a low power buffer that can operate at a target gain under various process, voltage, temperature, and device mismatch conditions. More specifically, some claims are directed to approaches for providing a gain control signal to a current shunt circuit to control the effect of a buffer gain boosting circuit, which claims advance the technical fields for addressing the problem of implementing a low power buffer that can operate at a target gain under various process, voltage, temperature, and device mismatch conditions, as well as advancing peripheral technical fields. Some claims improve the functioning of multiple systems within the disclosed environments.

Some embodiments of the present disclosure are directed to a buffer having a gain boost configuration and a current shunt circuit to control the gain of a respective gain boosting transistor of the gain boost configuration. The current shunt circuit and resulting gain are dynamically controlled by a gain control signal such that the buffer gain can be adjusted to within an acceptable range of the target gain for the current operating and device mismatch conditions. In one or more embodiments, the current shunt circuit redirects or "shunts" current from the boosting transistor to adjust (e.g., reduce) the gain of the boosting transistor and the gain of the overall buffer. In one or more embodiments, the gain boost configuration with dynamic gain control can be deployed in a full differential implementation. Both analog and digital dynamic calibration and control techniques can be used to provide the gain control signals to multiple current shunt circuits and multiple buffers.

Further details of aspects, objectives, and advantages of the disclosure are described below and in the detailed description, drawings, and claims. Both the foregoing general description of the background and the following detailed description are exemplary and explanatory, and are not intended to be limiting as to the scope of the claims.

BRIEF DESCRIPTION OF THE DRAWINGS

The drawings described below are for illustration purposes only. The drawings are not intended to limit the scope of the present disclosure.

DETAILED DESCRIPTION

Some embodiments of the present disclosure address the problem of implementing a low power buffer that can operate at a target gain under various process, voltage, temperature, and device mismatch conditions and some embodiments are directed to approaches for providing a gain control feedback signal to a current shunt circuit to control the effect of the buffer gain boosting circuit. More particularly, disclosed herein and in the accompanying figures are exemplary environments, methods, and systems for low power buffers with dynamic gain control.

Overview

High resolution, high speed analog-to-digital converters (ADCs) can require buffers to isolate a high impedance track-and-hold (TAH) stage from one or more sample-and-hold (SAH) stages preceding the ADC. Such buffer implementations can be a key component in enabling and advancing high speed communication (e.g., 100 Gigabit Ethernet) networks and systems. For example, a 28 Gbps serial link communication receiver might require multiple successive approximation register (SAR) ADCs, each with one or more buffers exhibiting at least the following characteristics: wide bandwidth, very fast large signal settling and slewing (e.g., low output impedance), high linearity over the full analog input signal, low noise, high power supply rejection, and high input impedance over the wide bandwidth (e.g., near or in excess of the Nyquist rate). Such receivers might also demand the buffer use a low supply voltage (e.g., 1V supply voltage), which further requires the buffer gain to be near unity. For example, a unity gain buffer might enable the buffer and the ADC to be powered by a common low supply voltage (e.g., 1V), providing both low power consumption by the buffer, and full use of the available ADC dynamic range.

A buffer having the aforementioned gain boost configuration exhibits such characteristics. The intrinsic gain of the buffer with the gain boost configuration can be set near a target gain (e.g., unity) by simulating the buffer over worst case process, voltage, temperature, and device mismatch (e.g., PVTM) variations and adjusting various design attributes (e.g., transistor sizes) to meet or exceed the target gain at all corners. However, the resulting actual gain of the manufactured buffer at a given operating condition can vary significantly from the target gain. As the speed of the underlying circuit fabrication processes increases (e.g., with the advancement of low supply voltage, high speed communication system implementations), such gain variations also increase.

Some embodiments of the present disclosure address the problem of implementing a low power buffer that can operate at a target gain under various process, voltage, temperature, and device mismatch conditions. More specifically, the techniques disclosed herein provide a buffer having a gain boost configuration and a current shunt circuit to control the gain of a respective gain boosting transistor of the gain boost configuration. The current shunt circuit and resulting gain are dynamically controlled by a gain control signal such that the buffer gain can be adjusted to within an acceptable range of the target gain for the current operating and device mismatch conditions. Both analog and digital dynamic calibration and control techniques can be used to provide the gain control signals to multiple current shunt circuits and multiple buffers.

Definitions

Some of the terms used in this description are defined below for easy reference. The presented terms and their respective definitions are not rigidly restricted to these definitions—a term may be further defined by the term's use within this disclosure.

The term "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion.

As used in this application and the appended claims, the term "or" is intended to mean an inclusive "or" rather than an exclusive "or". That is, unless specified otherwise, or is clear from the context, "X employs A or B" is intended to mean any of the natural inclusive permutations. That is, if X employs A, X employs B, or X employs both A and B, then "X employs A or B" is satisfied under any of the foregoing instances.

The articles "a" and "an" as used in this application and the appended claims should generally be construed to mean "one or more" unless specified otherwise or is clear from the context to be directed to a singular form.

The term "logic" means any combination of software or hardware that is used to implement all or part of the disclosure.

The term "non-transitory computer readable medium" refers to any medium that participates in providing instructions to a logic processor.

A "module" includes any mix of any portions of computer memory and any extent of circuitry including circuitry embodied as a processor.

Reference is now made in detail to certain embodiments. The disclosed embodiments are not intended to be limiting of the claims.

Descriptions of Exemplary Embodiments

Figure 1A:
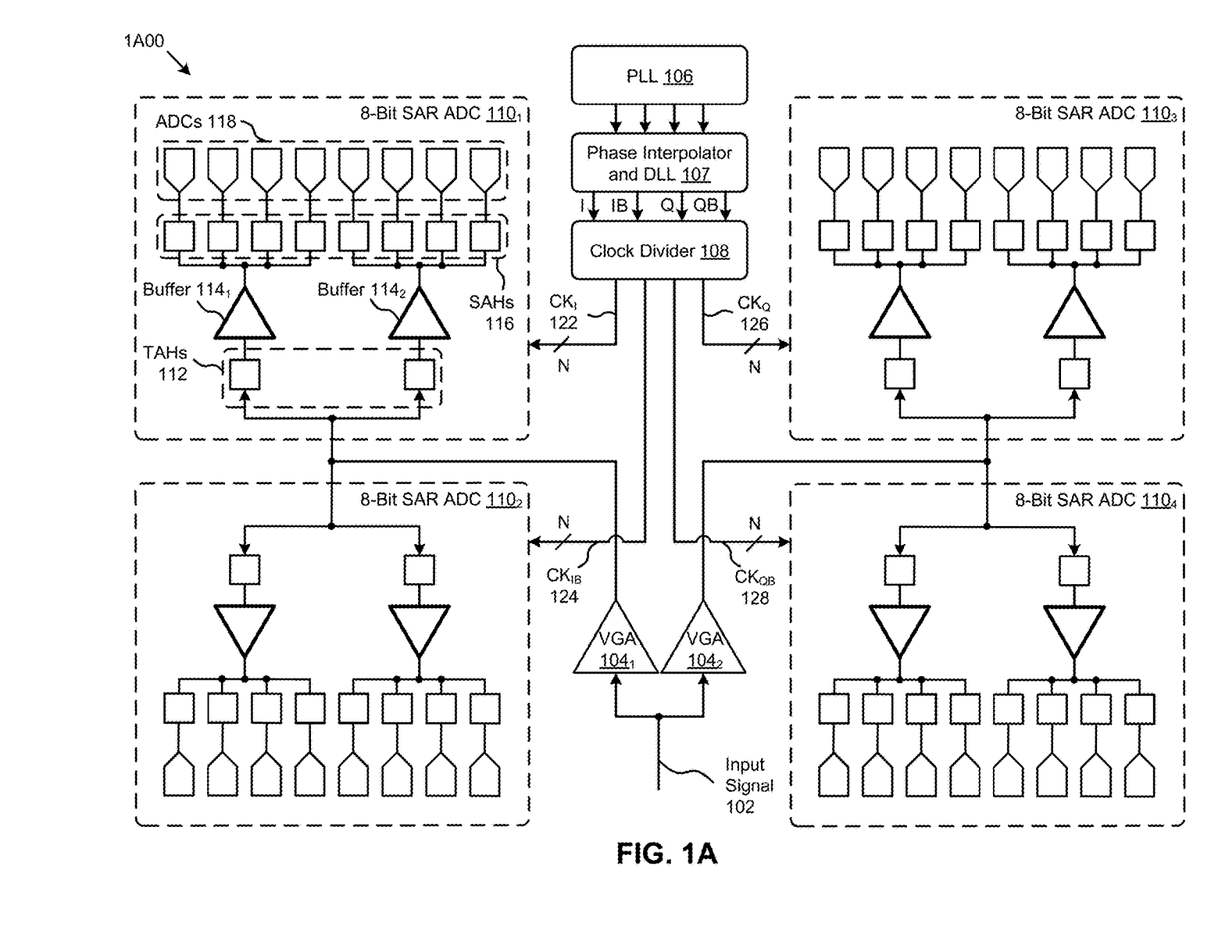
FIG. 1A presents a high speed serial link system in an environment that includes buffers.

FIG. 1A presents a high speed serial link system 1A00 in an environment that includes buffers. As an option, one or more instances of high speed serial link system 1A00 or any aspect thereof may be implemented in the context of the architecture and functionality of the embodiments described herein. Also, the high speed serial link system 1A00 or any aspect thereof may be implemented in any desired environment.

As shown in FIG. 1A, the high speed serial link receiver system 1A00 illustrates an environment that requires low power buffers with dynamic gain control to advance the speed and power capabilities of such systems. For example, the herein disclosed techniques for low power buffers with dynamic gain control can enable, in part, the high speed serial link receiver system 1A00 to be implemented in a low power, 8-lane, 28 Gbps serial link transceiver. The high speed serial link receiver system 1A00 can also be representative of similar systems in a variety of environments and applications, such as optical serial data communication links and memory data interfaces. Specifically, high speed serial link receiver system 1A00 receives an input signal 102 at a plurality of variable gain amplifiers 104 (e.g., VGA $104_1$ and VGA $104_2$) that drive amplified input signals to a plurality of 8-bit SAR ADCs 110 (e.g., 8-bit SAR ADC $110_1$, 8-bit SAR ADC $110_2$, 8-bit SAR ADC $110_3$, and 8-bit SAR ADC $110_4$). A set of clocks related to in-phase and quadrature-phase timing (e.g., $CK_I$ 122, $CK_{IB}$ 124, $CK_Q$ 126, and $CK_{QB}$ 128) are delivered to the respective ones of the plurality of 8-bit SAR ADCs 110 by a phase-locked loop (PLL), such as PLL 106, a phase interpolator and delay-locked loop (DLL), such as phase interpolator and DLL 107, and a clock divider 108. For the aforementioned low power, 8-lane, 28 Gbps serial link transceiver implementation, the PLL 106 can operate at 14 GHz, the phase interpolator and DLL 107 can operate at 7 GHz, and the clock divider 108 can provide divide-by-8 capability (e.g., generate a 12.5% duty cycle). As shown, each instance of the plurality of 8-bit SAR ADCs 110 will generate an 8-bit digital representation of the input signal 102 sampled at timing associated with the respective set of input clocks (e.g., $CK_I$ 122, $CK_{IB}$ 124, $CK_Q$ 126, and $CK_{QB}$ 128).

Further details of an instance of the plurality of 8-bit SAR ADCs 110 is shown in 8-bit SAR ADC $110_1$. Specifically, the amplified input signal from VGA $104_1$ is received by a plurality of track-and-hold circuits (e.g., see TAHs 112). Each instance of the plurality of TAHs 112 feeds a respective buffer (e.g., buffer $114_1$ and buffer $114_2$) that, in turn, feeds a plurality of sample-and-hold circuits (e.g., see SAHs 116). Each instance of the plurality of SAHs 116 provides a sampled version of the input signal 102 (e.g., at timing associated with clocks $CK_1$ 122) to a respective instance of a plurality of ADCs 118. Each instance of the plurality of ADCs 118 compare the sampled version of the input signal 102 to a respective reference voltage (not shown) to produce a 1-bit digital result that is combined with the results of the other instances of the plurality of ADCs 118 to produce the full 8-bit digital representation.

As previously mentioned, the herein disclosed techniques for low power buffers with dynamic gain control can enable, in part, the high speed serial link receiver system 1A00 to be implemented in a low power, 8-lane, 28 Gbps serial link transceiver. Specifically, such an implementation can require buffers (e.g., buffer $114_1$ and buffer $114_2$) to operate at 1V and have unity gain. However, variations in process, voltage, temperature, and device mismatch can result in gain variations that can impact the performance of the high speed serial link receiver system 1A00. For example, buffer $114_1$ and buffer $114_2$ can be designed to have an intrinsic gain of unity, but might exhibit an actual gain less than unity under a given set of conditions, decreasing the effective resolution of the 8-bit SAR ADCs $110_1$. A technique to dynamically control the buffer gain in the high speed serial link receiver system 1A00 is described in FIG. 1B.

Figure 1B:
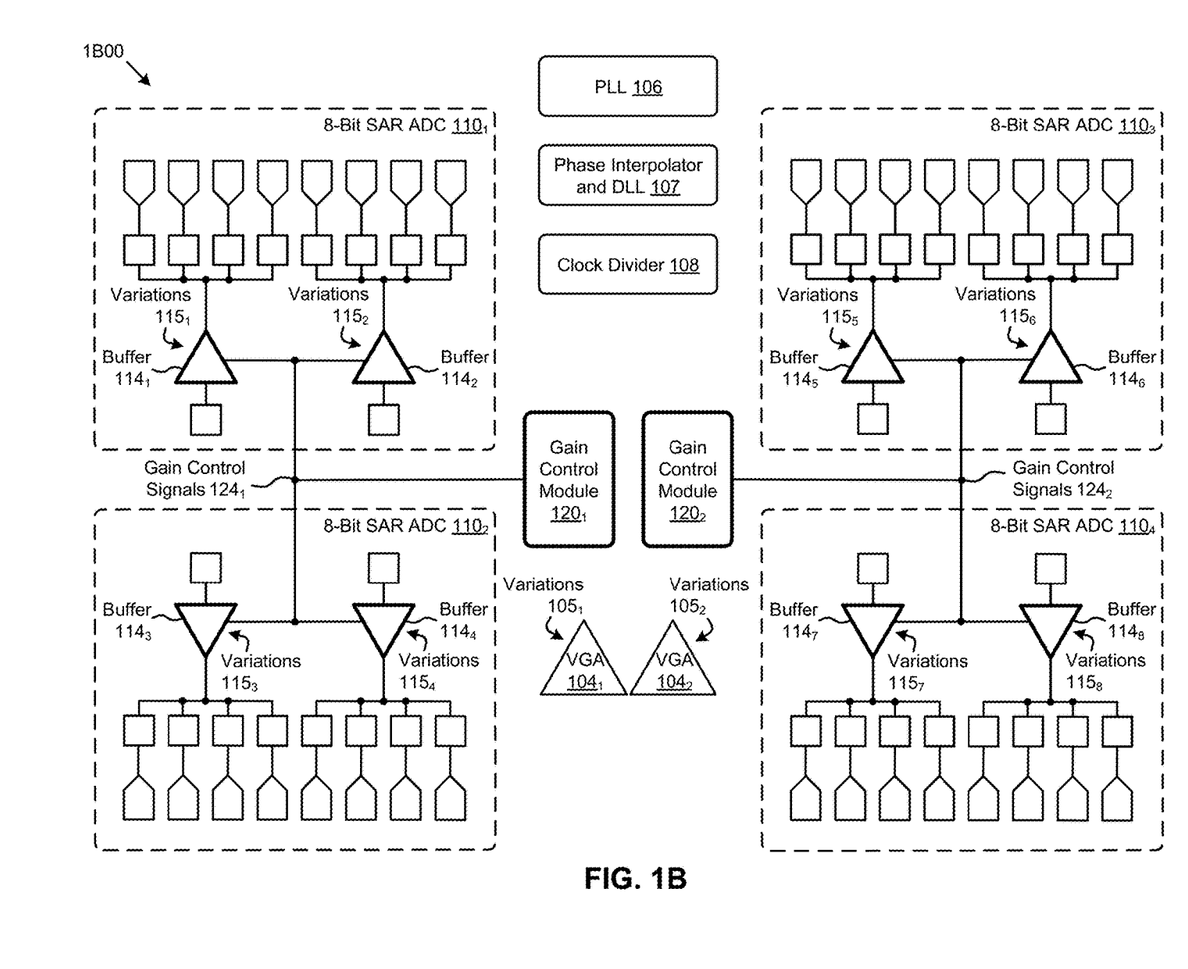
FIG. 1B is a diagram to illustrate gain control techniques used in environments that include buffers.

FIG. 1B is a diagram 1B00 to illustrate gain control techniques used in environments that include buffers. As an option, one or more instances of diagram 1B00 or any aspect thereof may be implemented in the context of the architecture and functionality of the embodiments described herein. Also, the diagram 1B00 or any aspect thereof may be implemented in any desired environment.

As shown in FIG. 1B, diagram 1B00 shows the functional components of the high speed serial link receiver system 1A00 of FIG. 1A interacting with a plurality of gain control modules 120 (e.g., gain control module $120_1$ and gain control module $120_2$). Specifically, the gain control module $120_1$ provides a set of gain control signals 1241 to a first set of buffers (e.g., buffer $114_1$, buffer $114_2$, buffer $114_3$, and buffer $114_4$) to adjust for a plurality of process, temperature, voltage, and device mismatch variations exhibited by the first set of buffers (e.g., variations $115_1$, variations $115_2$, variations $115_3$, and variations $115_4$, respectively). Further, the gain control module $120_2$ provides a set of gain control signals 1242 to a second set of multiple buffers (e.g., buffer $114_5$, buffer $114_6$, buffer $114_7$, and buffer $114_8$) to adjust for a plurality of process, temperature, voltage, and device mismatch variations exhibited by the second set of buffers (e.g., variations $115_5$, variations $115_6$, variations $115_7$, and variations $115_8$, respectively). In some cases, the plurality of VGAs 104 of the high speed serial link receiver system 1A00 can exhibit variations (e.g., variations $105_1$ and variations $105_2$, respectively) that can impact the gain control requirements. For example, the plurality of VGAs 104 can exhibit variations in a common mode output voltage that is passed on to the plurality of buffers 114. In this case, the plurality of gain control modules 120 might account for the variations in the common mode output voltage in the determination of the plurality of gain control signals 124. Further details describing a gain control module are disclosed in FIG. 2.

Figure 2:
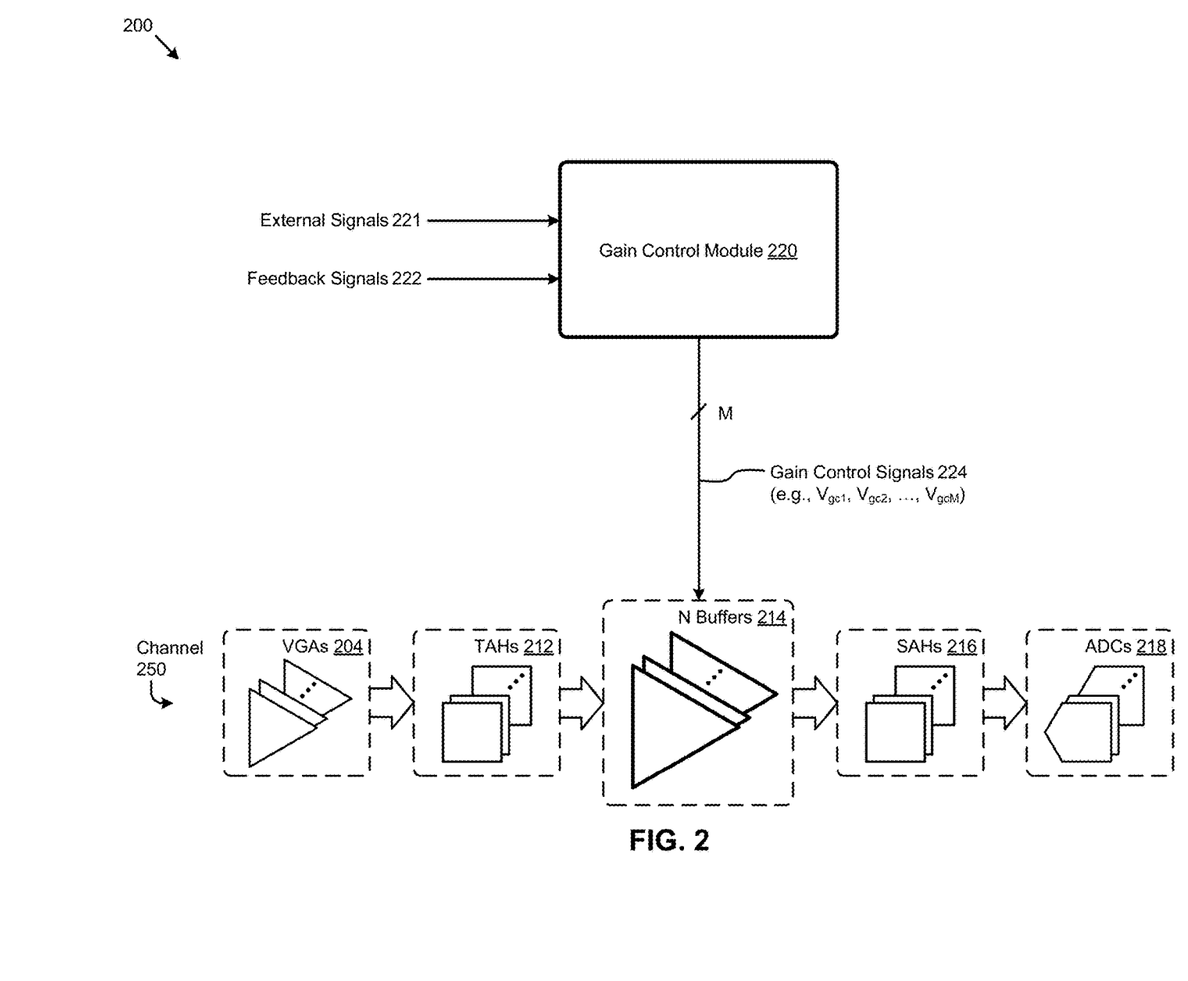
FIG. 2 is a block diagram of a high speed serial link receiver channel with gain control.

FIG. 2 is a block diagram 200 of a high speed serial link receiver channel with gain control. As an option, one or more instances of block diagram 200 or any aspect thereof may be implemented in the context of the architecture and functionality of the embodiments described herein. Also, the block diagram 200 or any aspect thereof may be implemented in any desired environment.

As shown in FIG. 2, the block diagram 200 comprises a gain control module 220 connected to a set of N buffers 214 included in a receiver channel 250. The set of N buffers 214 are preceded in the receiver channel 250 by a set of VGAs 204 that deliver input signals to a set of TAHs 212 that feed into the set of N buffers 214. As described in FIG. 1A, for example, one VGA can feed into four TAH circuits followed by a respective four buffers to isolate the TAH circuits from the subsequent stages in the channel. Other quantities and combinations are possible. The block diagram 200 further shows a set of SAHs 216 following the set of N buffers 214, and a set of ADCs 218 following the set of SAHs 216. As described in FIG. 1A, for example, one buffer can drive four SAH circuits followed by a respective four ADCs. Other quantities and combinations are possible.

As shown, the gain control module 220 can further receive a set of external signals 221 and a set of feedback signals 222. For example, the external signals 221 can serve to provide one or more indications of the conditions related to the environment in which the gain control module 220 operates (e.g., bias voltages, common mode voltages, etc.). Further, for example, the feedback signals 222 can serve to provide one or more indications of the results produced by the gain control module 220 (e.g., gain measurements, etc.). The gain control module 220 further provides a set of gain control signals 224 (e.g., M signals: $V_{gc1}$, $V_{gc2}$, . . . , to $V_{gcM}$) to the set of N buffers 214. In one or more embodiments, M is equal to N such that each buffer in the set of N buffers 214 receives a dedicated signal from the set of gain control signals 224. In one or more embodiments, N is greater than M (e.g., N:M is 4:1) such that a signal from the set of gain control signals 224 is broadcast to multiple buffers in the set of N buffers 214. Such broadcast implementations can be used to manage power consumption, die area, and other design constraints.

Figure 3:
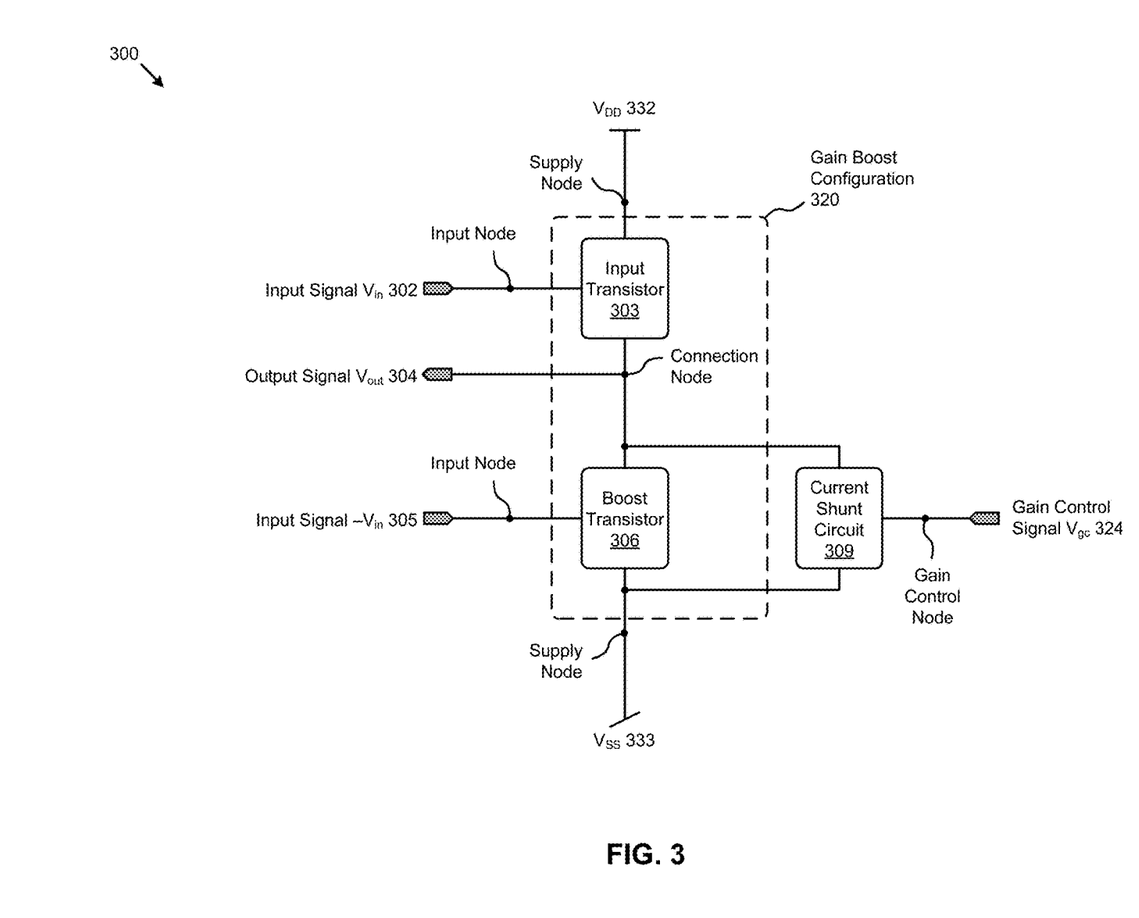
FIG. 3 is a block diagram of a gain boost buffer with dynamic gain control, according to some embodiments.

As mentioned previously, to advance the speed and power capabilities of high speed communication networks and systems, the respective buffers in the set of N buffers 214 are required to exhibit low power consumption, unity gain, and other performance characteristics (e.g., wide bandwidth, very fast large signal settling and slewing, high linearity over the full analog input signal, low noise, high power supply rejection, and high input impedance over the wide bandwidth). The respective buffers in the set of N buffers 214 are also required to receive gain control signals (e.g., such as the gain control signals 224 provided by the gain control module 220) to enable the set of N buffers 214 to operate at a target gain under various process, voltage, temperature, and device mismatch conditions. FIG. 3 discloses such a low power buffer with dynamic gain control that can receive a gain control signal.

FIG. 3 is a block diagram 300 of a gain boost buffer with dynamic gain control. As an option, one or more instances of block diagram 300 or any aspect thereof may be implemented in the context of the architecture and functionality of the embodiments described herein. Also, the block diagram 300 or any aspect thereof may be implemented in any desired environment.

As shown in FIG. 3, block diagram 300 depicts a buffer with a gain boost configuration 320 comprising an input transistor 303 coupled to a positive power supply $V_{DD}$ 332 and coupled to a boost transistor 306. The input transistor 303 and the boost transistor 306 receive an input signal $V_{in}$ 302 and an input signal $-V_{in}$ 305, respectively, where the input signal $-V_{in}$ 305 is the complement of the input signal $V_{in}$ 302. A second signal that is a "complement" of a first signal is of equal magnitude and opposite polarity from that of the first signal with respect to a common reference. For example, a first voltage signal $V_1$ at +300 mV above a 500 mV voltage reference (e.g., $V_1$=800 mV) can have a complementary second voltage signal $V_2$ at −300 mV below the 500 mV voltage reference (e.g., $V_2$=200 mV). Such complementary signals (e.g., differential signals) are available in many electronic systems (e.g., high speed communications systems). An output signal $V_{out}$ 304 is provided at a connection node where the input transistor 303 is coupled to the boost transistor 306.

A "gain boost" is provided by the gain boost configuration 320 due, in part, to the in-phase contribution to the output signal $V_{out}$ 304 of the two transistors in response to the input signal $V_{in}$ 302 and its complement, input signal $-V_{in}$ 305. For example, the input transistor 303 can comprise an N-type MOSFET device configured (e.g., with load devices) to generate a non-inverting response to input signal $V_{in}$ 302, and the boost transistor 306 can comprise an N-type MOSFET device configured (e.g., with load devices) to generate an inverting response to input signal $-V_{in}$ 305, such that the combined contributions of both transistors "boost" the voltage at output signal $V_{out}$ 304 in both directions. An intrinsic gain boost and overall gain of the gain boost configuration 320 can be determined, in part, by various design attributes (e.g., MOSFET device size or dimensions). However, dynamic gain control techniques are needed to enable the gain boost configuration 320 to operate at a target gain under various process, voltage, temperature, and device mismatch conditions.

As shown in block diagram 300, the herein disclosed techniques for implementing a low power buffer with dynamic gain control include a current shunt circuit 309 coupled in parallel with the boost transistor 306. The current shunt circuit 309 serves to redirect current around the boost transistor 306 to adjust (e.g., reduce) the amount of gain boost provided by the boost transistor 306 and the overall gain of the buffer. The amount of current redirected from the boost transistor 306 and through the current shunt circuit 309 is controlled by a gain control signal $V_{gc}$ 324 (e.g., from the gain control module 220). The gain control signal $V_{gc}$ 324 can respond to device-specific and real-time variations in operating conditions (e.g., temperature fluctuations, etc.) such that a dynamic gain control of the boost transistor 306 is provided. Various embodiments and implementations of the gain boost configuration with dynamic gain control are described in FIG. 4 and FIG. 5.

Figure 4:
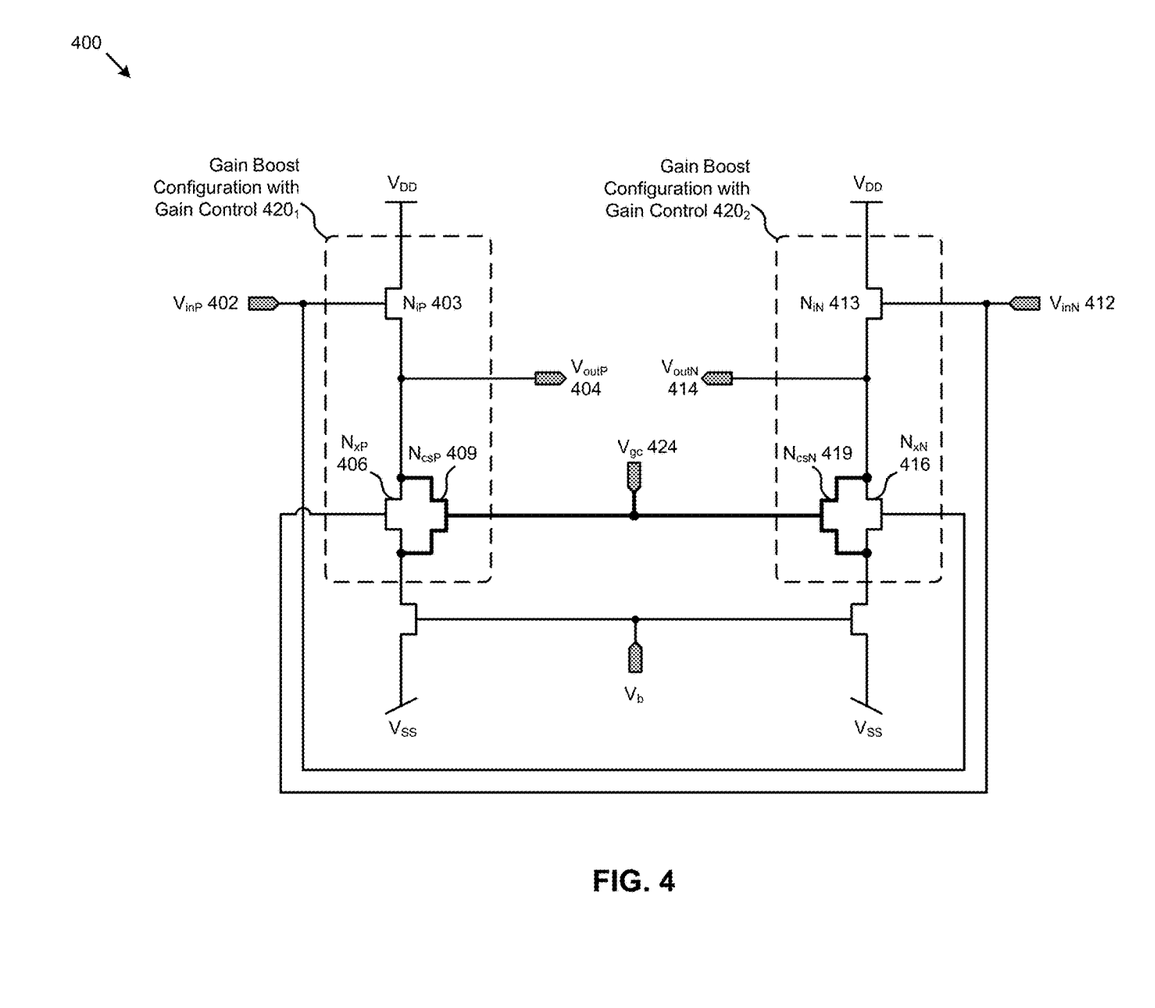
FIG. 4 is a schematic of a differential gain boost buffer with dynamic gain control, according to an embodiment.

FIG. 4 is a schematic 400 of a differential gain boost buffer with dynamic gain control. As an option, one or more instances of schematic 400 or any aspect thereof may be implemented in the context of the architecture and functionality of the embodiments described herein. Also, the schematic 400 or any aspect thereof may be implemented in any desired environment.

As shown in FIG. 4, schematic 400 depicts two instances of a gain boost configuration with gain control 420 (e.g., gain boost configuration with gain control $420_1$ and gain boost configuration with gain control $420_2$) coupled together to receive a differential input signal across an input signal $V_{inP}$ 402 and an input signal $V_{inN}$ 412, and produce a differential output signal across an output signal $V_{outP}$ 404 and an output signal $V_{outN}$ 414. Specifically, the gain boost configuration with gain control $420_1$ produces the output signal $V_{outP}$ 404 and comprises a device $N_{iP}$ 403 (e.g., serving as an instance of the input transistor 303) and a device $N_{xP}$ 406 (e.g., serving as an instance of the boost transistor 306) that receive input signal $V_{inP}$ 402 and input signal $V_{inN}$ 412, respectively, where input signal $V_{inN}$ 412 is the complement of input signal $V_{inP}$ 402. The gain boost configuration with gain control $420_1$ further comprises a device $N_{csP}$ 409 (e.g., serving as an instance of the current shunt circuit 309) coupled in parallel to device $N_{xP}$ 406 and controlled by a gain control signal $V_{gc}$ 424. As further shown in schematic 400, the gain boost configuration with gain control $420_2$ produces the output signal $V_{outN}$ 414 and comprises a device $N_{iN}$ 413 (e.g., serving as an instance of the input transistor 303) and a device $N_{xN}$ 416 (e.g., serving as an instance of the boost transistor 306) that receive input signal $V_{inN}$ 412 and input signal $V_{inP}$ 402, respectively, where input signal $V_{inP}$ 402 is the complement of input signal $V_{inN}$ 412. The gain boost configuration with gain control $420_2$ further comprises a device $N_{csN}$ 419 (e.g., serving as an instance of the current shunt circuit 309) coupled in parallel to device $N_{xN}$ 416 and controlled by the gain control signal $V_{gc}$ 424.

Figure 5:
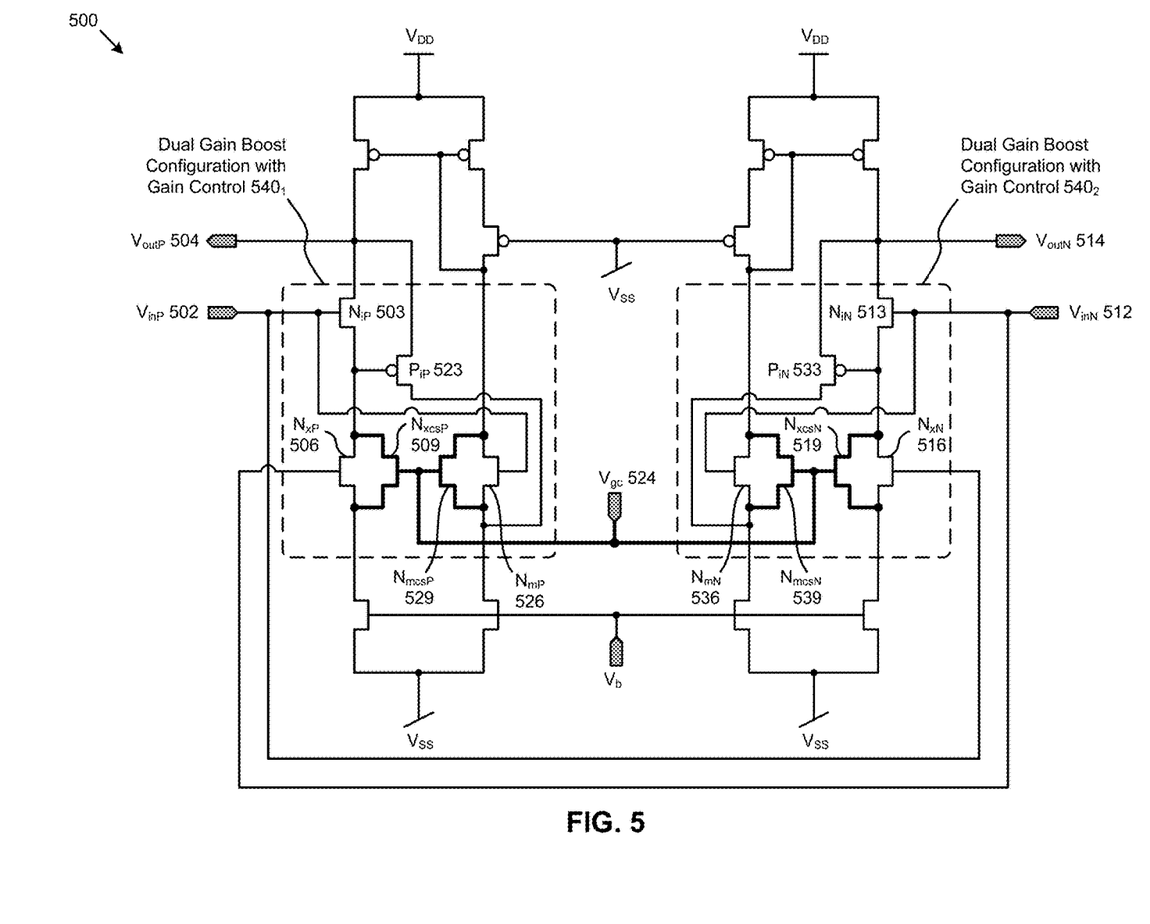
FIG. 5 is a schematic of a differential dual gain boost buffer with dynamic gain control, according to some embodiments.

FIG. 5 is a schematic 500 of a differential dual gain boost buffer with dynamic gain control. As an option, one or more instances of schematic 500 or any aspect thereof may be implemented in the context of the architecture and functionality of the embodiments described herein. Also, the schematic 500 or any aspect thereof may be implemented in any desired environment.

As shown in FIG. 5, schematic 500 depicts two instances of a dual gain boost configuration with gain control 540 (e.g., dual gain boost configuration with gain control 540₁ and dual gain boost configuration with gain control 540₂) coupled together to receive a differential input signal across an input signal $V_{inP}$ 502 and an input signal $V_{inN}$ 512, and to produce a differential output signal across an output signal $V_{outP}$ 504 and an output signal $V_{outN}$ 514. Specifically, the dual gain boost configuration with gain control 540₁ produces the output signal $V_{outP}$ 504 and comprises a device $N_{iP}$ 503 (e.g., serving as an instance of the input transistor 303) and a device $V_{xP}$ 506 (e.g., serving as an instance of the boost transistor 306) that receive input signal $V_{inP}$ 502 and input signal $V_{inN}$ 512, respectively, where input signal $V_{inN}$ 512 is the complement of input signal $V_{inP}$ 502. A device $P_{iP}$ 523 and a device $N_{mP}$ 526 comprise the second pair of the "dual" pair of transistors in the dual gain boost configuration with gain control 540₁. The dual gain boost configuration with gain control 540₁ further comprises a device $N_{xcsP}$ 509 (e.g., serving as an instance of the current shunt circuit 309) coupled in parallel to device $N_{xP}$ 506 and controlled by a gain control signal $V_{gc}$ 524, and a device $N_{mcsP}$ 529 (e.g., serving as an instance of the current shunt circuit 309) coupled in parallel to device $N_{mP}$ 526 and controlled by the gain control signal $V_{gc}$ 524. As also shown in schematic 500, the dual gain boost configuration with gain control 540₂ produces the output signal $V_{outN}$ 514 and comprises a device $N_{iN}$ 513 (e.g., serving as an instance of the input transistor 303) and a device $N_{xN}$ 516 (e.g., serving as an instance of the boost transistor 306) that receive input signal $V_{inN}$ 512 and input signal $V_{inP}$ 502, respectively, where input signal $V_{inN}$ 512 is the complement of input signal $V_{inP}$ 502. A device $P_{iN}$ 533 and a device $N_{mN}$ 536 comprise the second pair of the "dual" pair of transistors in the dual gain boost configuration with gain control 540₂. The dual gain boost configuration with gain control 540₂ further comprises a device $N_{xcsN}$ 519 (e.g., serving as an instance of the current shunt circuit 309) coupled in parallel to device $N_{xN}$ 516 and controlled by the gain control signal $V_{gc}$ 524, and a device $N_{mcsN}$ 539 (e.g., serving as an instance of the current shunt circuit 309) coupled in parallel to device $N_{mN}$ 536 and controlled by the gain control signal $V_{gc}$ 524.

Figure 6A:
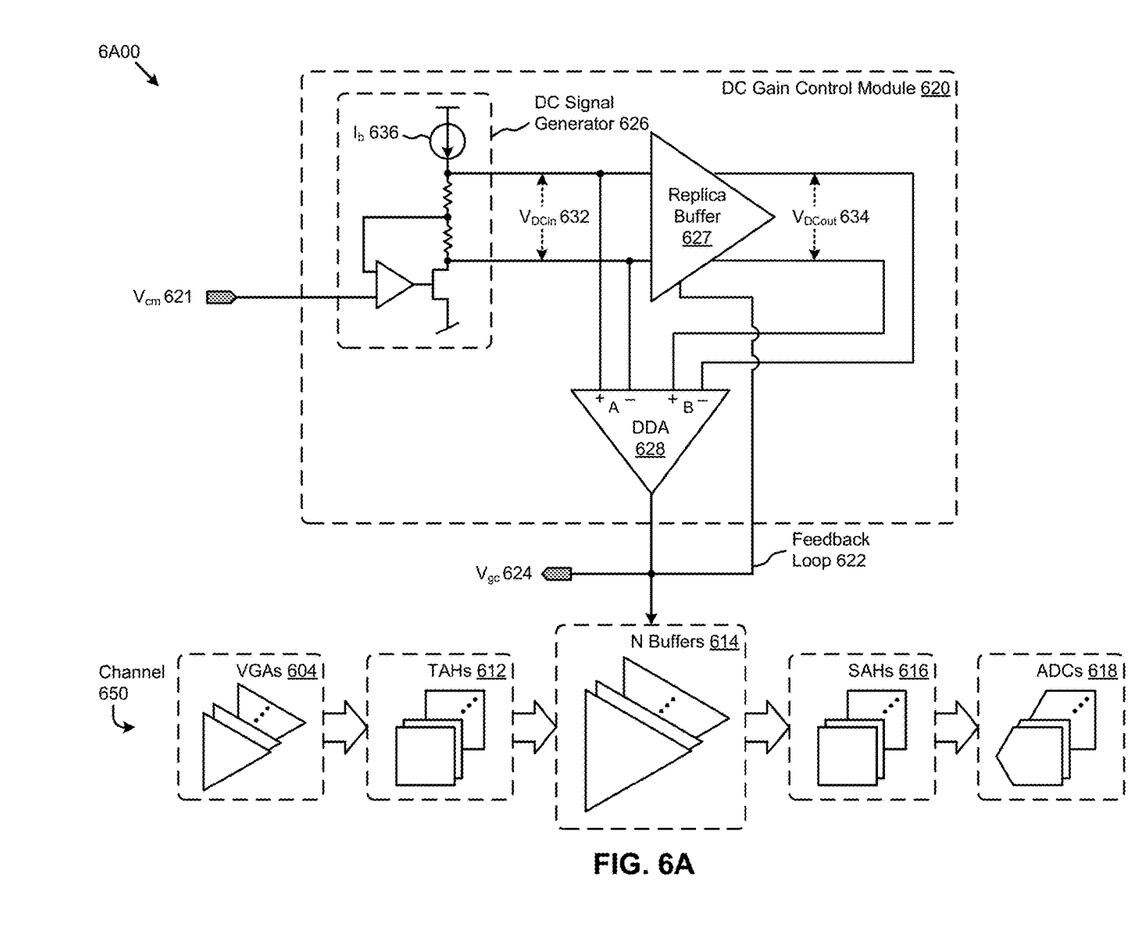
FIG. 6A is a schematic of a DC gain control technique as used to implement a low power buffer with dynamic gain control, according to an embodiment.
Figure 6B:
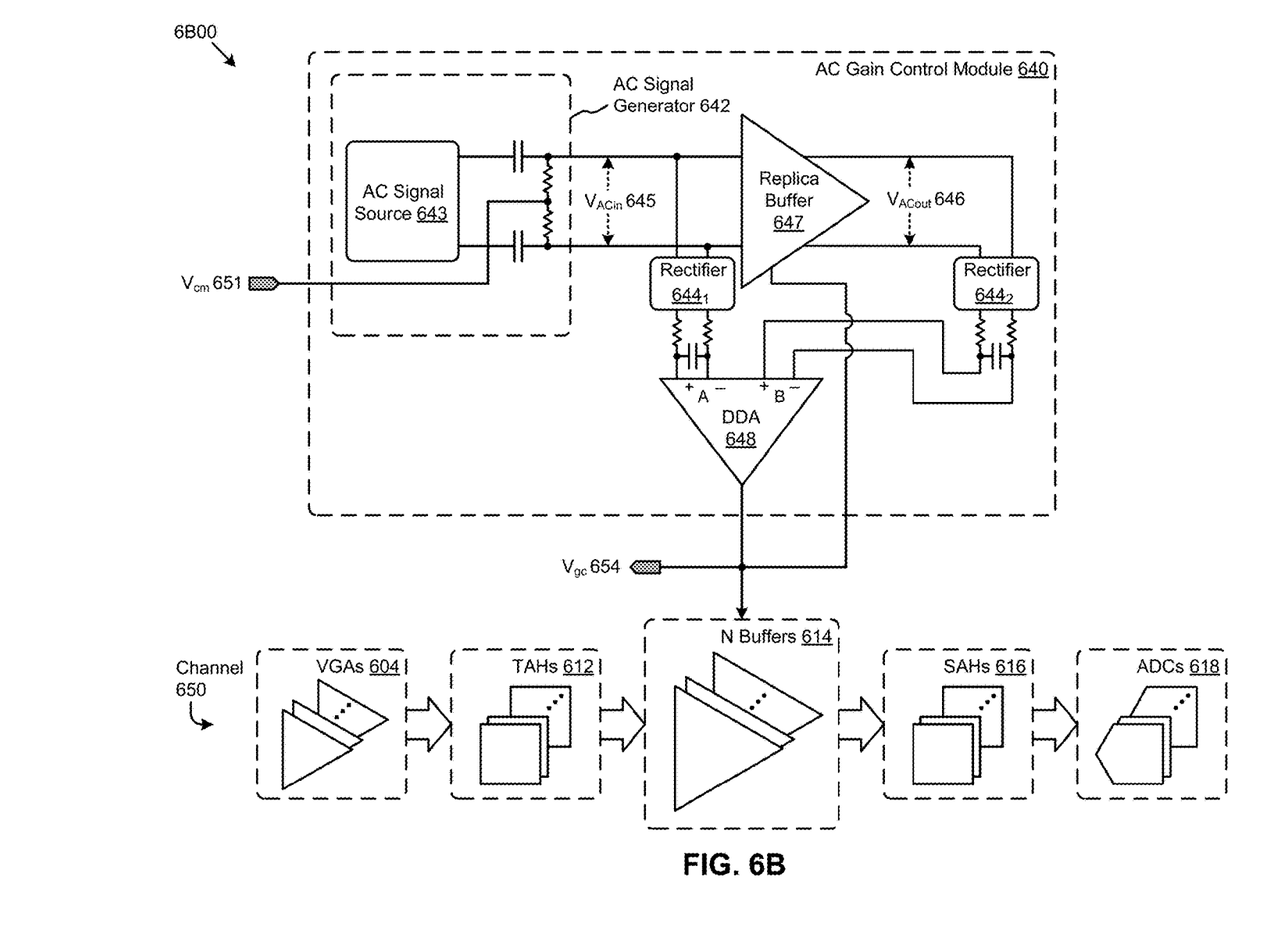
FIG. 6B is a schematic of an AC gain control technique as used to implement a low power buffer with dynamic gain control, according to an embodiment.
Figure 7:
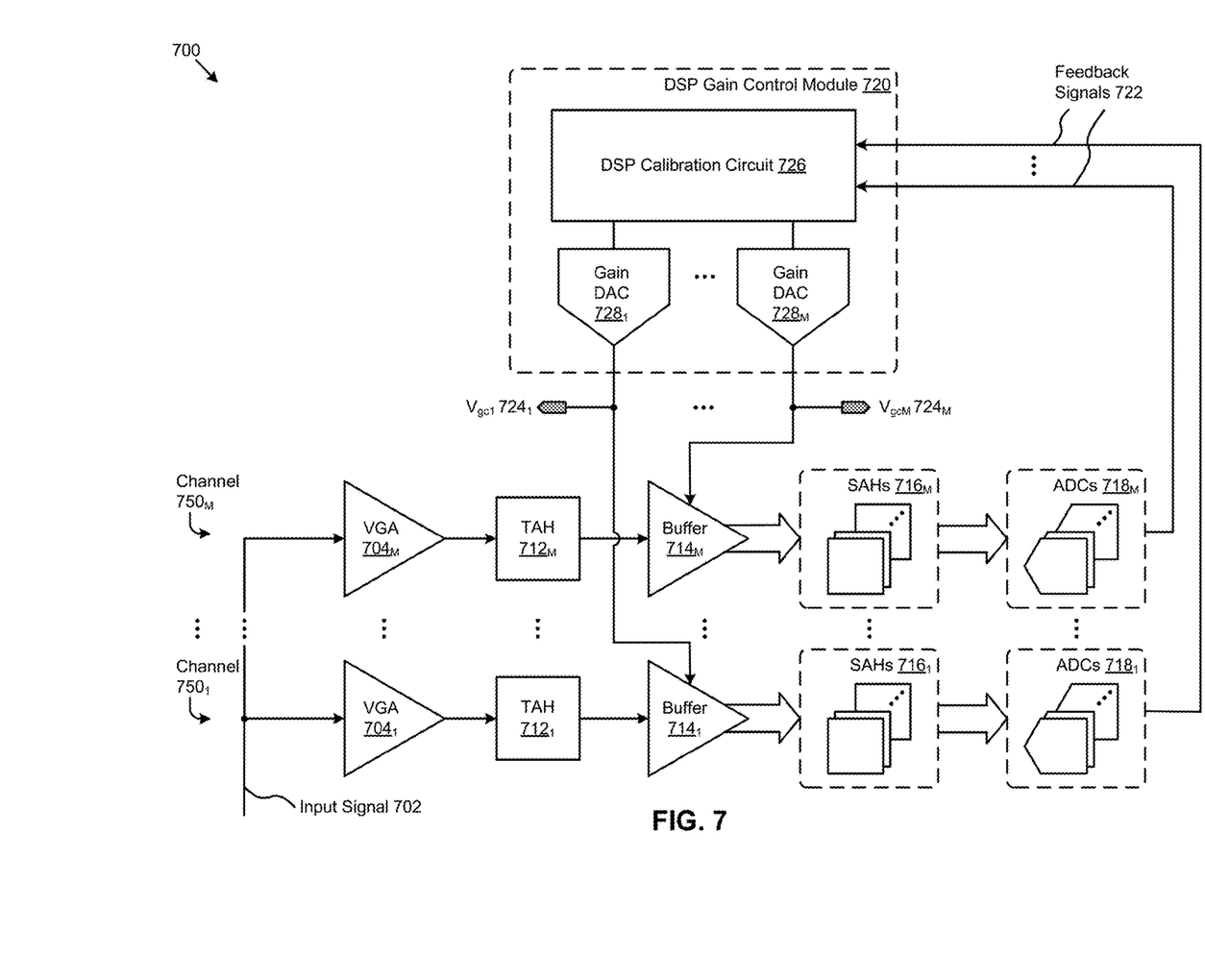
FIG. 7 is a schematic of a DSP gain control technique as used to implement a low power buffer with dynamic gain control, according to an embodiment.

The aforementioned gain control devices in FIG. 4 and FIG. 5 (e.g., device $N_{csP}$ 409, device $N_{csN}$ 419, device $N_{xcsP}$ 509, device $N_{mcsP}$ 529, device $N_{xcsN}$ 519, and device $N_{mcsN}$ 539) control the gain of the gain boost devices (e.g., device $N_{xP}$ 406, device $N_{xN}$ 416, device $N_{xP}$ 506, device $N_{mP}$ 526, device $N_{xN}$ 516, and device $N_{mN}$ 536, respectively) using, in part, the respectively connected gain control signals (e.g., $V_{gc}$ 424 and $V_{gc}$ 524). FIG. 6A, FIG. 6B, and FIG. 7 disclose techniques for generating such gain control signals.

FIG. 6A is a schematic 6A00 of a DC gain control technique as used to implement a low power buffer with dynamic gain control. As an option, one or more instances of schematic 6A00 or any aspect thereof may be implemented in the context of the architecture and functionality of the embodiments described herein. Also, the schematic 6A00 or any aspect thereof may be implemented in any desired environment.

As shown in FIG. 6A, the schematic 6A00 comprises a DC gain control module 620 that provides a gain control signal $V_{gc}$ 624 to a set of N buffers 614. The set of N buffers 614 can be included in a receiver channel 650 that further comprises a set of VGAs 604, a set of TAHs 612, a set of SAHs 616, and a set of ADCs 618. The number N of buffers served by a given instance of the DC gain control module 620 can vary (e.g., N=1, N=2, . . . , etc.). The DC gain control module 620 further comprises a DC signal generator 626, a replica buffer 627, and a double difference amplifier, such as DDA 628. In one or more embodiments, the replica buffer 627 serves as a proxy for the buffers included in the N buffers 614 for the purpose of dynamic gain control and does not serve in a functional receiver channel (e.g., is not "active" in the receiver channel 650 or any other receiver channel). More specifically, the replica buffer 627 in the DC gain control module 620 can comprise the design characteristics of the respective buffer included in the set of N buffers 614 such that the intrinsic gain of the replica buffer and the intrinsic gain of the respective buffer included in the set of N buffers 614 will be closely matched. For example, the replica buffer 627 and the respective buffers in the set of N buffers 614 can all be configured as described in schematic 500 of FIG. 5. Further, the replica buffer 627 can be physically located near the set of N buffers 614 such that the replica buffer 627 experiences near the same operating conditions (e.g., voltage, temperature, etc.) as the respective buffers included in the set of N buffers 614. Since the replica buffer 627 also receives the gain control signal $V_{gc}$ 624 via a feedback loop 622, gain adjustments applied to the replica buffer 627 by the DC gain control module 620 will also be applied to the set of N buffers 614. Such gain adjustments are determined as described below.

The replica buffer 627 receives from the DC signal generator 626 a differential DC input signal $V_{DCin}$ 632 and produces a differential DC output signal $V_{DCout}$ 634, defining a replica buffer gain $G_{rb}$ as follows:

$$G_{rb}=V_{DCout}/V_{DCin} \quad [\text{EQ. 1}]$$

More specifically, the DC signal generator 626 receives a common mode voltage $V_{cm}$ 621 (e.g., from the set of VGAs 604) to set a common mode voltage of the differential DC input signal $V_{DCin}$ 632, and generates a bias current $I_b$ 636 to set the amplitude of the differential DC input signal $V_{DCin}$ 632. As an example, the bias current $I_b$ 636 can be set to 40 µA to generate a 200 mV amplitude of the differential DC input signal $V_{DCin}$ 632. The DDA 628 compares the magnitude of the differential DC input signal $V_{DCin}$ 632 (e.g., see differential input "A" of DDA 628) and the differential DC output signal $V_{DCout}$ 634 (e.g., see differential input "A" of DDA 628), and using the feedback loop 622, sets the replica buffer gain $G_{rb}$ to:

$$G_{rb}=g_{mA}/g_{mB} \quad [\text{EQ. 2}]$$

where:
gmA is the differential transconductance of input stage A, and
gmB is the differential transconductance of input stage B.

For example, to achieve unity gain, the ratio $g_{mA}:g_{mB}$ can be set to 1:1 (e.g., by sizing the devices comprising the input stages of the DDA 628). For other target gains, the transconductance of the input stages of the DDA 628 can be scaled to various ratios (e.g., for $G_{rb}=2$, $g_{mA}:g_{mB}$ can be 2:1).

The DC gain control techniques described in schematic 6A00 can provide dynamic gain control to multiple low power buffers. To manage the power consumed by the analog components of the DC gain control module 620, the gain control signal $V_{gc}$ 624 from each instance of the DC gain control module 620 can be broadcast to multiple buffers (e.g., N=4). In such cases, device mismatch effects can still cause undesired variations from the target gain (e.g., ±3% variation). As an alternative, a low power dynamic gain control technique is presented in FIG. 7.

FIG. 6B is a schematic 6B00 of an AC gain control technique as used to implement a low power buffer with dynamic gain control. As an option, one or more instances of schematic 6B00 or any aspect thereof may be implemented in the context of the architecture and functionality of the embodiments described herein. Also, the schematic 6B00 or any aspect thereof may be implemented in any desired environment.

The schematic 6B00 illustrates an AC gain control module 640 that provides a gain control signal $V_{gc}$ 654 to the set of N buffers 614 included in the receiver channel 650 described in FIG. 6A. The AC gain control module 640 further comprises an AC signal generator 642, a replica buffer 647, a plurality of rectifiers 644 (e.g., rectifier $644_1$ and rectifier $644_2$), and a double difference amplifier, such as DDA 648. As compared to the DC gain control module 620 in FIG. 6A, the AC gain control module 640 in FIG. 6B uses an AC signal to sense the gain in the replica buffer 647 and determine the gain control signal $V_{gc}$ 654 for the set of N buffers 614. Such an AC gain control technique might account for certain dynamic effects when controlling gain. Specifically, the AC signal generator 642 comprises an AC signal source 643 (e.g., oscillator, DAC, etc.) to provide a differential AC input signal $V_{ACin}$ 645 to the replica buffer 647 that, in response, provides a differential AC output signal $V_{ACout}$ 646. In some embodiments, the AC signal source 643 can be configured to provide a target frequency and a target amplitude of the differential AC input signal $V_{ACin}$ 645. The AC signal generator 642 further receives a common mode voltage $V_{cm}$ 651 (e.g., from the set of VGAs 604) to set a common mode voltage of the differential AC input signal $V_{ACin}$ 645. The plurality of rectifiers 644 serve as peak detectors to provide the respective peak values (e.g., DC voltages) of the differential AC input signal $V_{ACin}$ 645 and the differential AC output signal $V_{ACout}$ 646 to the DDA 648 such that the gain control signal $V_{gc}$ 654 can be produced by the DDA 648 as described in FIG. 6A.

FIG. 7 is a schematic 700 of a DSP gain control technique as used to implement a low power buffer with dynamic gain control. As an option, one or more instances of schematic 700 or any aspect thereof may be implemented in the context of the architecture and functionality of the embodiments described herein. Also, the schematic 700 or any aspect thereof may be implemented in any desired environment.

As shown in FIG. 7, the schematic 700 comprises a DSP gain control module 720 that provides a plurality of gain control signals 724 (e.g., $V_{gc1}$ $724_1$, . . . , to $V_{gcM}$ $724_M$) to a respective plurality of buffers 714 (e.g., buffer $714_1$, . . . , to buffer $714_M$) included in a respective plurality of receiver channels 750 (e.g., receiver channel $750_1$, . . . , to receiver channel $750_M$). In the shown embodiment, each instance of the plurality of receiver channels 750 comprises a single VGA (e.g., VGA $704_1$, . . . , to VGA $704_M$), followed by a single TAH circuit (e.g., TAH $712_1$, . . . , to TAH $712_M$), followed by a single buffer from the plurality of buffers 714 (e.g., buffer $714_1$, . . . , to buffer $714_M$), followed by multiple SAH circuits (e.g., SAHs $716_1$, . . . , to SAH $716_M$) and multiple ADCs (e.g., ADCs $718_1$, . . . , to ADCs $718_M$). As an example, each instance of the plurality of receiver channels 750 can generate an 8-bit digital representation of an analog input signal received by the respective VGA in a given instance of the plurality of receiver channels 750.

The DSP gain control module 720 further comprises a DSP calibration circuit 726, and a plurality of gain DACs 728 (e.g., gain DAC $728_1$, . . . , to gain DAC $728_M$). Each instance of the plurality of gain DACs 728 provides a respective instance of the plurality of gain control signals 724. In one or more embodiments, the plurality of gain control signals 724 are determined, in part, by receiving an input signal 702 at one or more instances of the plurality of receiver channels 750 and producing a digital representation of the input signal 702 at respective instances of the plurality of ADCs 718. The digital representations of the input signal 702 are then received as a set of feedback signals 722 by the DSP calibration circuit 726 of the DSP gain control module 720. The feedback signals 722 are processed by the DSP calibration circuit 726 to determine one or more gain adjustments to be applied to respective instances of the plurality of buffers 714. For example, the DSP calibration circuit 726 can compare (e.g., using a least squares linear regression) a set of digital representations of the input signal 702 generated by the respective instances of the plurality of receiver channels 750, and dynamically adjust the gain of the respective plurality of buffers 714 such that the gains through the plurality of receiver channels 750 are aligned to a common value.

The dynamic gain control enabled by the DSP gain control module 720 shown in schematic 700 uses digital techniques that maintain low power and allow control of individual buffers, reducing the effect of device mismatch on gain control accuracy.

Additional Embodiments of the Disclosure

Figure 8A:
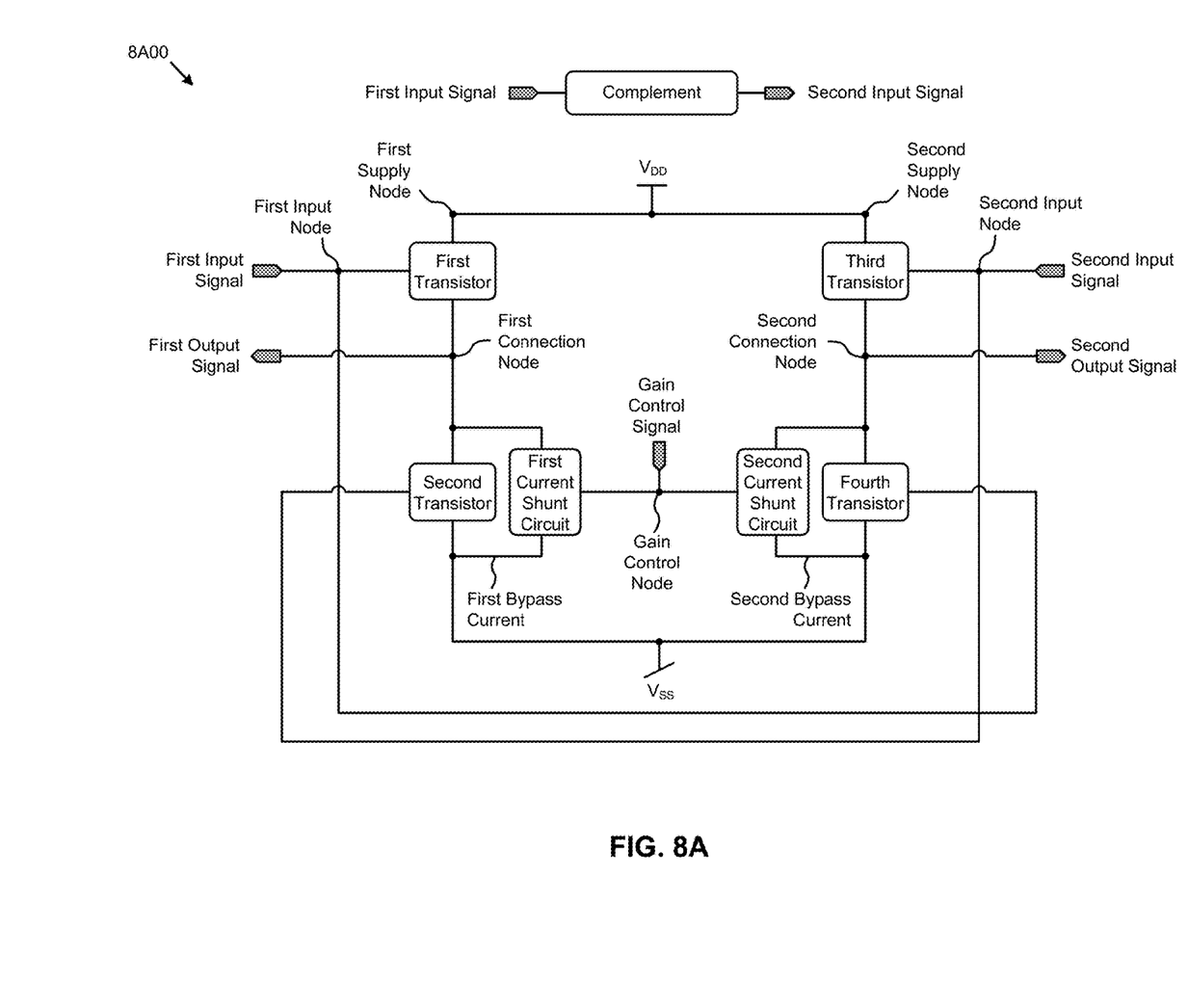
FIG. 8A is a block diagram of a system for implementing dynamic gain control, according to an embodiment.

FIG. 8A is a block diagram 8A00 of a system for low power buffer with dynamic gain control, according to some embodiments. As an option, one or more instances of block diagram 8A00 or any aspect thereof may be implemented in the context of the architecture and functionality of the embodiments described herein. Also, block diagram 8A00 or any aspect thereof may be implemented in any desired environment.

Shown in block diagram 8A00 is a buffer circuit comprising: a first input node to receive a first input signal; a second input node to receive a second input signal; a first connection node; a second connection node; a first supply node; a second supply node; a first transistor coupled to the first input node, the first supply node, and the first connection node; a second transistor coupled to the second input node and the first connection node; a third transistor coupled to the second input node, the second supply node, and the second connection node; a fourth transistor coupled to the first input node and the second connection node; a first current shunt circuit coupled to the second transistor; and a second current shunt circuit coupled to the fourth transistor; wherein the second input signal is a complement of the first input signal, and wherein the first current shunt circuit shunts a first bypass current around the second transistor and the second current shunt circuit shunts a second bypass current around the fourth transistor to adjust a differential gain of the buffer circuit, wherein the differential gain is defined by a differential output amplitude of a differential output signal divided by a differential input amplitude of a differential input signal, wherein the differential output signal is the difference between the first output signal at the first connection node and a second output signal at the second connection node, and the differential input signal is the difference between the first input signal and the second input signal.

As shown in block diagram 8A00 the second input signal is the complement of the first input signal. More specifically, the second input signal is of equal magnitude and opposite polarity from that of the first input signal with respect to a common reference. For example, a first voltage signal $V_1$ at +300 mV above a 500 mV voltage reference (e.g., $V_1$=800 mV) can have a complementary second voltage signal $V_2$ at −300 mV below the 500 mV voltage reference (e.g., $V_2$=200 mV). Such complementary signals (e.g., differential signals) are available in many electronic systems (e.g., high speed communications systems).

Figure 8B:
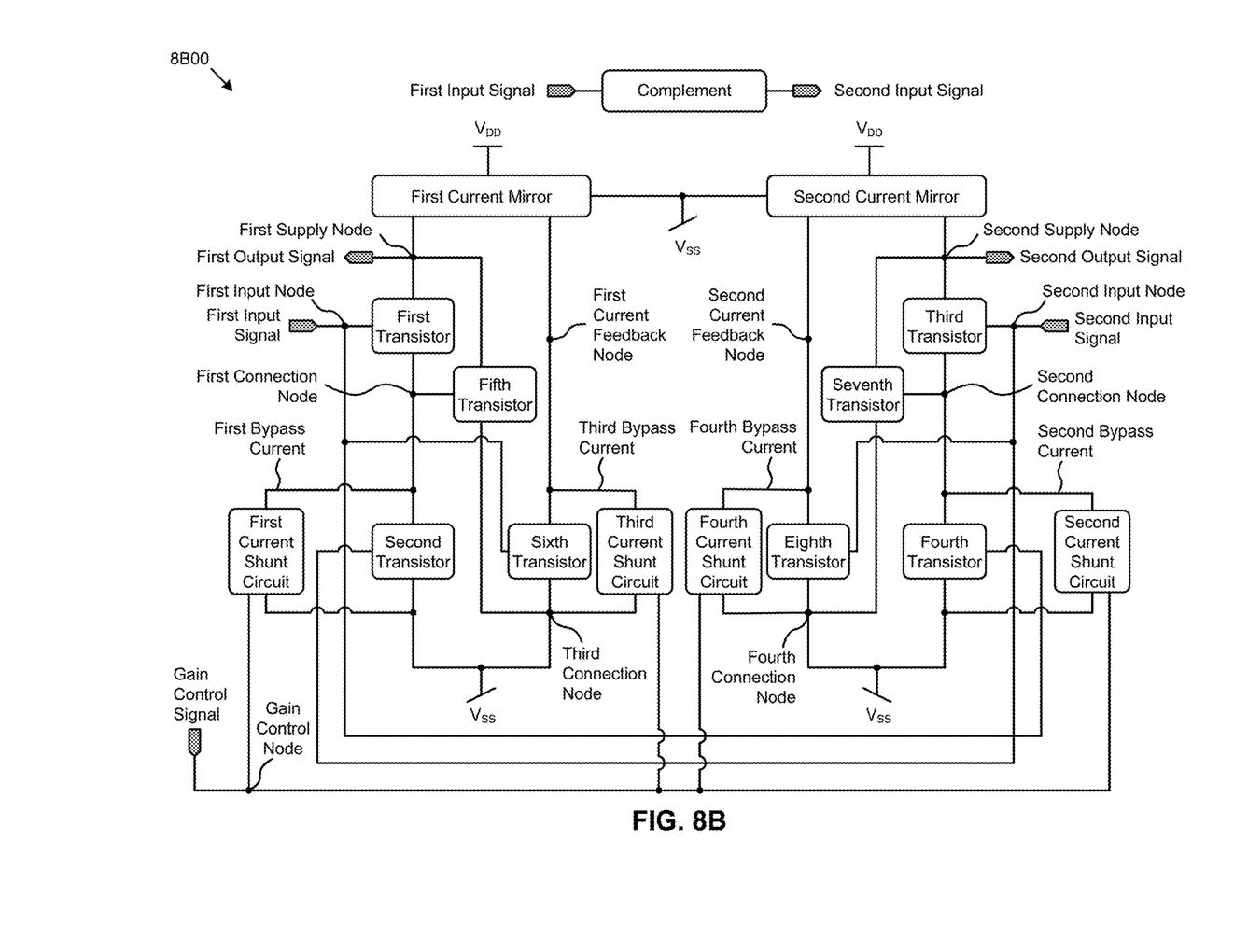
FIG. 8B is a block diagram of a system for implementing dynamic gain control, according to an embodiment.

FIG. 8B is a block diagram 8B00 of a system for low power buffer with dynamic gain control, according to some embodiments. As an option, one or more instances of block diagram 8B00 or any aspect thereof may be implemented in the context of the architecture and functionality of the embodiments described herein. Also, block diagram 8B00 or any aspect thereof may be implemented in any desired environment.

Shown in block diagram 8B00 is a buffer circuit comprising: a first input node to receive a first input signal; a second input node to receive a second input signal; a first connection node; a third connection node; a second connection node; a fourth connection node; a first supply node; a second supply node; a first current feedback node; a second current feedback node; a first transistor coupled to the first input node, the first supply node, and the first connection node; a second transistor coupled to the second input node and the first connection node; a fifth transistor coupled to the first connection node, the first supply node, and the third connection node; a sixth transistor coupled to the first input node, the first current feedback node, and the third connection node; a third transistor coupled to the second input node, the second supply node, and the second connection node; a fourth transistor coupled to the first input node and the second connection node; a seventh transistor coupled to the second connection node, the second supply node, and the fourth connection node; an eighth transistor coupled to the second input node, the second current feedback node, and the fourth connection node; a first current mirror coupled to the first current feedback node and the first supply node; a second current mirror coupled to the second current feedback node and the second supply node; a first current shunt circuit coupled to the second transistor; a third current shunt circuit coupled to the sixth transistor; a second current shunt circuit coupled to the fourth transistor; and a fourth current shunt circuit coupled to the eighth transistor; wherein the second input signal is a complement of the first input signal, and wherein the first current shunt circuit shunts the first bypass current around the second transistor, the second current shunt circuit shunts a second bypass current around the fourth transistor, the third current shunt circuit shunts the third bypass current around the sixth transistor, and the fourth current shunt circuit shunts a fourth bypass current around the eighth transistor to adjust a differential gain of the buffer circuit, wherein the differential gain is defined by a differential output amplitude of a differential output signal divided by a differential input amplitude of a differential input signal, wherein the differential output signal is the difference between the first output signal at the first supply node and a second output signal at the second supply node, and the differential input signal is the difference between the first input signal and the second input signal.

In the foregoing specification, the disclosure has been described with reference to specific embodiments thereof. It will, however, be evident that various modifications and changes may be made thereto without departing from the broader spirit and scope of the disclosure. For example, the above-described process flows are described with reference to a particular ordering of process actions. However, the ordering of many of the described process actions may be changed without affecting the scope or operation of the disclosure. The specification and drawings are, accordingly, to be regarded in an illustrative sense rather than in a restrictive sense.

What is claimed is:

1. A communication system for communication over a receiver channel comprising:
   a plurality of buffer circuits in the receiver channel, at least some of the plurality of buffer circuits electrically connected to a gain control signal; and
   a DC gain control signal generation circuit comprising:
      a DC signal generator that generates a bias current to set amplitudes of a pair of differential DC biasing signals;
      a replica buffer having inputs that are electrically connected to the pair of differential DC biasing signals, the replica buffer to serve as a proxy for the plurality of buffer circuits in the receiver channel, and the replica buffer having at least one pair of differential DC output signals; and
      a double difference amplifier that is electrically connected to the at least one pair of differential DC output signals and to the pair of differential DC biasing signals to produce the gain control signal that is electrically connected to at least some of the plurality of buffer circuits in the receiver channel.

2. The communication system of claim 1, wherein the replica buffer in the DC gain control signal generation circuit exhibits a set of design characteristics that correspond to design characteristics of a respective buffer of the plurality of buffer circuits in the receiver channel.

3. The communication system of claim 1, wherein a first intrinsic gain of the replica buffer in the DC gain control signal generation circuit and a second intrinsic gain of the respective buffer of the plurality of buffer circuits in the receiver channel are matched.

4. The communication system of claim 1, wherein the replica buffer in the DC gain control signal generation circuit is physically located near at least one of the plurality of buffer circuits in the receiver channel.

5. The communication system of claim 1 wherein the replica buffer in the DC gain control signal generation circuit experiences a first set of operating conditions and at least one of the plurality of buffer circuits in the receiver channel experiences a matched set of operating conditions.

* * * * *